(12) United States Patent
März et al.

(10) Patent No.: US 11,290,102 B2
(45) Date of Patent: Mar. 29, 2022

(54) PROTECTION OF A FIELD-EFFECT TRANSISTOR, WHICH IS OPERATED IN A SWITCHING MODE, AGAINST AN OVERLOAD CURRENT

(71) Applicant: Siemens Aktiengesellschaft, Munich (DE)

(72) Inventors: Andreas März, Leinburg (DE); Mark-Matthias Bakran, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 13 days.

(21) Appl. No.: 16/965,870

(22) PCT Filed: Dec. 28, 2018

(86) PCT No.: PCT/EP2018/097090
§ 371 (c)(1),
(2) Date: Jul. 29, 2020

(87) PCT Pub. No.: WO2019/149437
PCT Pub. Date: Aug. 8, 2019

(65) Prior Publication Data
US 2021/0058081 A1 Feb. 25, 2021

(30) Foreign Application Priority Data

Jan. 30, 2018 (EP) .................... 18154076

(51) Int. Cl.
*H03K 17/082* (2006.01)
*H02M 1/08* (2006.01)
*H03K 17/14* (2006.01)

(52) U.S. Cl.
CPC .......... *H03K 17/0822* (2013.01); *H02M 1/08* (2013.01); *H03K 17/145* (2013.01)

(58) Field of Classification Search
CPC .......... H02M 1/08; H02M 1/32; H02M 1/325; H03K 17/0822; H03K 17/145
See application file for complete search history.

(56) References Cited

U.S. PATENT DOCUMENTS

| 4,920,447 A | 4/1990 | Peppel |
| 5,394,287 A | 2/1995 | Sakata et al. |

(Continued)

OTHER PUBLICATIONS

PCT International Search Report and Written Opinion of International Searching Authority dated Mar. 28, 2019 corresponding to PCT International Application No. PCT/EP2018/097090 filed Dec. 28, 2018.

*Primary Examiner* — Kyle J Moody
*Assistant Examiner* — Jye-June Lee
(74) *Attorney, Agent, or Firm* — Henry M. Feiereisen LLC

(57) ABSTRACT

In a method for protecting a field-effect transistor, which is operated in a switching mode, against an overload current in a switched-on switching state, an electric drain-source voltage between a drain connection and a source connection of the field-effect transistor is detected. The drain-source voltage is compared with a predefined voltage comparison value, and the field-effect transistor is switched into a switched-off switching state in the event that the drain-source voltage is greater than the voltage comparison value. For the purpose of providing a temperature compensation of the protection, the temperature of the field-effect transistor is detected; and the voltage comparison value is adjusted depending on the temperature. The voltage comparison value is, in addition, also dependent on time during the switched-on switching state.

9 Claims, 6 Drawing Sheets

(56) References Cited

U.S. PATENT DOCUMENTS

| | | | | |
|---|---|---|---|---|
| 5,621,601 | A | * | 4/1997 | Fujihira ............ H03K 17/0822 361/93.9 |
| 5,898,557 | A | * | 4/1999 | Baba .................. H03K 17/0822 361/103 |
| 2013/0094114 | A1 | * | 4/2013 | Shimizu ............... H03K 17/082 361/87 |
| 2017/0163255 | A1 | | 6/2017 | Graf |
| 2017/0331369 | A1 | | 11/2017 | Sugimoto et al. |

* cited by examiner

PROTECTION OF A FIELD-EFFECT TRANSISTOR, WHICH IS OPERATED IN A SWITCHING MODE, AGAINST AN OVERLOAD CURRENT

CROSS-REFERENCES TO RELATED APPLICATIONS

This application is the U.S. National Stage of International Application No. PCT/EP2018/097090, filed Dec. 28, 2018, which designated the United States and has been published as International Publication No, WO 2019/149437 A1 and which claims the priority of European Patent Application, Serial No. 18154076.6, filed Jan. 30, 2018, pursuant to 35 U.S.C. 119(a)-(d).

BACKGROUND OF THE INVENTION

The invention relates to a method for protecting a field-effect transistor that is operated in a switching mode against an overload current in a turned-on switching state, in which method an electrical drain-source voltage is detected between a drain terminal and a source terminal of the field-effect transistor, the drain-source voltage is compared with a predefined voltage comparison value, and the field-effect transistor is switched into a turned-off switching state if the drain-source voltage is greater than the voltage comparison value, wherein a temperature of the field-effect transistor is measured for the purpose of a temperature compensation of the protection, and the voltage comparison value is set as a function of the temperature. The invention further relates to a protective device for a field-effect transistor operated in a switching mode to protect against an overload current in a turned-on switching state, for which purpose the protective device is embodied to detect an electrical drain-source voltage between a drain terminal and a source terminal of the field-effect transistor, to compare the drain-source voltage with a predefined voltage comparison value, and to switch the field-effect transistor into a turned-off switching state if the drain-source voltage is greater than the voltage comparison value, and, for the purpose of providing a temperature compensation of the protection, to measure a temperature of the field-effect transistor, and to adjust the voltage comparison value as a function of the temperature. Finally, the invention also relates to a field-effect transistor.

Field-effect transistors are employed at many points in sectors of electronics in order to enable a wide diversity of electrical functions to be realized. Field-effect transistors find application in electrical hardware circuits that serve to implement predefined functions. In the data processing field, hardware circuits of said type may be e.g. digital memories, computer devices, logic circuits and/or the like. High-performance field-effect transistors have also become available in the interim, finding application e.g. in the electrical energy technology sector, for example in a static AC-to-AC converter, in an electronic power supply unit and/or the like. Field-effect transistors may have a different construction depending on the field of application.

A field-effect transistor typically has at least three electrodes as terminals, specifically a source terminal, a drain terminal and a gate terminal. A flow of current between the drain terminal and the source terminal can be adjusted by means of a suitable control voltage between the gate terminal and the source terminal.

Field-effect transistors may basically be embodied as junction field-effect transistors or also as insulated-gate field-effect transistors (Metal Oxide Semiconductor Field Effect Transistor (MOSFET)) or the like. In addition, insulated-gate field-effect transistors in particular may have a fourth electrode as a terminal, referred to as a bulk terminal, though frequently this is implemented not as a separate terminal of the field-effect transistor but instead may often be connected to the source terminal inside the field-effect transistor.

Field-effect transistors are frequently operated in a switching mode. The switching mode of operation of the field-effect transistor means that in a turned-on switching state a very small electrical resistance or on-state resistance is provided between the terminals of the field-effect transistor forming the switching path, in this case the drain terminal and the source terminal, such that a high current flow is possible in the presence of a small forward voltage or drain-source voltage. In the turned-off switching state, on the other hand, the switching path of the field-effect transistor is high-ohmic, i.e. it provides a high electrical resistance, with the result that even when a high voltage or drain-source voltage is present on the switching path, substantially no current flow or only a very small, in particular negligible, current flow is present. A different mode from this is a linear mode of operation, in which intermediate states may also be assumed almost continuously. However, the field-effect transistor is usually operated in the switching mode both in digital technology and in the energy technology sector. Field-effect transistors of the MOSFET type find application in particular in the field of energy technology in energy converters such as AC-to-AC converters, DC-to-AC inverters, DC-to-DC converters and/or the like.

In order to improve a power density in energy converters, for example in DC-to-AC inverters, DC-to-DC converters or the like, the use of field-effect transistors, in particular of the unipolar wide-bandgap power semiconductor type, represents a huge application potential compared to conventional prior art bipolar transistors on account of the possible lower switching losses.

During the normal operation of an energy converter according to specifications, a fault situation may result due to a malfunction of a component of the AC-to-AC converter or a connected component.

One of said fault situations may be a short-circuit. In this context, different short-circuit scenarios may be determined.

In a first case of a short-circuit, the field-effect transistor may initially be in a turned-off switching state and may then be turned on during an existing short-circuit.

In a second case of a short-circuit, the field-effect transistor may already be conducting a normal current in the turned-on switching state by means of its switching path when a short-circuit occurs due to a further transistor that cooperatively interacts with the field-effect transistor, for example in a half-bridge circuit or the like. The transistor may likewise be a field-effect transistor, for example.

In a third case of a short-circuit, the field-effect transistor may already be conducting a normal current in the turned-on switching state by means of its switching path when a short-circuit occurs due to a short-circuit of a diode and/or the like.

The first, second and third short-circuit cases are characterized in that the current through the switching path increases very rapidly, being able in the extreme case to be limited only by parasitic inductances, until the field-effect transistor is desaturated and as a result the further increase in the current is limited.

A further situation which can be distinguished is that of the overcurrent case, in which a drain current or a source current of the field-effect transistor increases more slowly.

In the turned-on switching state, the field-effect transistor is usually biased into conduction as far as possible in order to minimize a residual voltage between the drain terminal and the source terminal so as to reduce on-state power losses to a minimum also in the turned-on switching state.

Overall, it is desired to detect the different cases for short-circuits as well as the overcurrent case as far as possible as a function of the temperature so that the respective short-circuit or overcurrent case can be easily distinguished from a normal mode of operation hi the turned-on switching state, i.e. from a fault-free operating case.

In order to determine the aforementioned fault cases, it is already well-known in the prior art to detect the desaturation of the switching path. This is usually used also in the case of bipolar transistors. For this purpose, the electrical voltage across the switching path is measured starting from a predefined, permanently set blanking time in which the short-circuit detection is deactivated. The measured voltage is compared with a comparison voltage that is set to a permanently predefined value, e.g. 15 V or the like. If the measured voltage is greater than the comparison voltage and if the time that has elapsed in the turned-on switching state since the transistor was turned on is greater than the blanking time, this is identified as a short-circuit. The blanking time is in this case set to a fixed, predefined value.

Since field-effect transistors, in particular MOSFETs, as unipolar semiconductor components have a switching path that exhibits a resistance-like behavior in the turned-on switching state, the voltage comparison value for detecting a short-circuit can be chosen smaller. e.g. 7 V or the like. Preferably, the voltage comparison value amounts for example to approximately three times the drain-source voltage in the turned-on switching state that drops across the switching path when a rated current is applied to it.

The drain-source voltage in the turned-on switching state, also referred to as the forward voltage, is dependent on the temperature of the field-effect transistor, in particular on a junction temperature. Owing to the high temperature dependence of the forward voltage in some cases, in particular in the case of planar and trench SiC MOSFETs, the temperature dependence can lead to a possible change by almost a factor of 2 in the forward voltage as a function of the temperature. This can have an impact on the detection of the short-circuit.

In order to reduce problems in this regard, it is common practice in the prior art to set the voltage comparison value as a function of the temperature. For this purpose, it may be provided to measure the temperature of the field-effect transistor by means of a temperature sensor, e.g. a temperature-dependent resistor or the like. In this connection, US 2017/0331369 A1 discloses an energy converter as well as a method for controlling the same. US 2017/0163255 A1 discloses an apparatus with integrated protection profile and a method for this.

Even if the known approach has proved to be effective, there is still room for improvement. Thus, it has been shown that the voltage comparison value, because it is constant, even when it is set as a function of temperature, must nonetheless still be chosen so high that a reliable protection of the field-effect transistor cannot be guaranteed with certainty in every operating situation, At least it must be expected that if an overload event such as an occurrence of the above-described overload current events happens, a premature ageing of the field-effect transistor may occur, and this may lead to undesirable consequences subsequently.

The object underlying the invention is to improve the protection of the field-effect transistor against overload current.

SUMMARY OF THE INVENTION

To achieve this object, a method, a protective device and a field-effect transistor according to the independent claims are proposed by means of the invention.

Advantageous developments will become apparent from features of the dependent claims.

With regard to a generic method, it is proposed in particular that the voltage comparison value will in addition also be dependent on time during the turned-on switching state.

With regard to a generic protective device, it is proposed in particular that the protective device be further embodied to set the voltage comparison value in addition also as a function of time during the turned-on switching state.

With regard to a generic field-effect transistor, it is proposed in particular that the latter have a protective device according to the invention.

The invention is based on the idea that the protection function in relation to the overload current can be considerably improved by a suitable adjustment of the voltage comparison value over time. In this case the adjustment of the voltage comparison value takes into account specific properties of the field-effect transistor or the circuit to which it may be connected not only as a function of temperature but also as a function of time. The voltage comparison value is therefore preferably not only exclusively temperature-dependent but in addition also at least in part time-dependent. The temperature dependence also may be limited to specific ranges of the time segment in which the field-effect transistor is in the turned-on switching state. This enables the special properties that may be present in field-effect transistors in each case to be explored in a highly flexible manner.

It proves particularly advantageous in this case if the protective device is embodied in addition as adjustable so that the protection effect according to the invention can be adjusted almost individually. For example, it can be provided that the protective device be programmable and the dependence of the voltage comparison value both on temperature and on time can be adjusted according to requirements. It can be provided that the setting of the protective device be carried out during its manufacture or else at the time of an initial commissioning of the field-effect transistor in an electronic circuit in which it is connected. Furthermore, it is of course also possible to embody the protective device in such a way that it also allows an adjustment to be performed at a later time, for example in the course of a maintenance activity or the like.

The protective device may be formed by an electronic hardware circuit which may at least to some extent also be integrated into a semiconductor chip that provides the field-effect transistor itself. However, a separate module may also be provided that is arranged e.g. integrated into a housing of the field-effect transistor and connected in a suitable manner to the field-effect transistor.

The protective device may comprise a hardware circuit that provides the desired or required functionality. However, the hardware circuit may also be formed at least in part by a computer unit that is controlled by means of a suitable computer program in order to provide the desired functionality. This enables the protective device also to be embodied as programmable in a simple manner.

The field-effect transistor is preferably a MOSFET, in particular a MOSFET of the enhancement-mode type.

During the turned-on switching state means in the present context that no change in the switching state of the field-effect transistor takes place in this period of time that characterizes the turned-on switching state. Turned-on and turned-off switching states may however succeed one another in time in alternation. Preferably, therefore, a turned-on switching state and a turned-off switching state will always follow one another immediately in time in alternation. During a turned-on switching state therefore means in particular a period of time in which the field-effect transistor is in the turned-on switching state, and which is between two immediately adjacent switching states of the turned-off switching state.

With regard to the exponential varying of the voltage reduction value, it is furthermore provided that a time constant be chosen adjusted to a decay time constant of an oscillation of the drain-source voltage. This embodiment can take into account that an oscillation which is damped can occur when the turned-on switching state is assumed or when the field-effect transistor is turned on. The corresponding decay time constant of said damped oscillation can be taken into account accordingly in the exponential varying of the voltage reduction value. An almost optimal adjustment of the protection function according to the invention can be achieved as a result.

According to an advantageous development, it is proposed that the voltage comparison value be reduced during the turned-on switching state as a function of time. What can be achieved by this measure is that a short-circuit event is wrongly detected due to unwanted effects occurring during normal operation, though said effects form none of the aforementioned short-circuit events. It can thus be achieved by this means e.g. that transient responses that may occur in the event of a change from a turned-off switching state to a turned-on switching state do not lead in an unwanted manner to a short-circuit detection, By reducing the voltage comparison value as a function of time it can be achieved that transient responses occurring immediately after the field-effect transistor is turned on are taken into account only if they result in an increased current value. The reliability of the detection of an overload current can be improved further as a result.

It is furthermore proposed that the voltage comparison value be reduced by a predefined voltage reduction value at a predefined first time point during the turned-on switching state. This embodiment too enables the reliability of the voltage detection to be improved. With this development it is at the same time possible to achieve a particularly advantageous simple realization of the reduction in the voltage comparison value as a function of time. Thus, e.g. for a time period from the immediate turning-on of the field-effect transistor up to the first time point, a first voltage comparison value may be provided, the voltage comparison value at the first time point being set to a smaller voltage comparison value. This can be achieved by means of the voltage reduction value. It is however also possible to provide two different voltage comparison values which are switched over only at the first time point, A simple and cost-effective realization can be achieved by this means.

According to an advantageous development, it is proposed that the first time point likewise be dependent on the temperature. This enables the protective effect of the invention to be improved further. Thus, it may be provided that the first time point lies earlier in time with increasing temperature. The time window for the voltage comparison value before the first time point can be reduced in size as a result in order to enable thermal effects of the field-effect transistor, in particular of the semiconductor chip, to be better taken into account. In alternative embodiments in which it may be beneficial, it may furthermore also be provided that the first time point lies at a later time point with increasing temperature. Of course, it is also possible to combine these embodiments with one another and thereby enable e.g. a functional relationship to be realized between the position of the first time point within the turned on switching state as a function of temperature. Different physical effects of the field-effect transistor can be better taken into account by means of this embodiment.

The first time point preferably lies earlier with increasing temperature. Typical specific thermal properties of field-effect transistors can be suitably taken into account by this measure.

According to a development, it is proposed that the voltage comparison value be set to a constant value between a turn-on time point of the field-effect transistor and the first time point. This measure enables in particular short-circuits of the first and second case and where applicable also of the third case to be effectively detected. Generally, short-circuits of said type are particularly critical and often only dependent to an insignificant extent on the temperature. It is therefore not absolutely necessary in this embodiment to set the voltage comparison value between the turn-on time point of the field-effect transistor and the first time point also as a function of temperature. Rather, it may be sufficient in this case to provide a fixed value which can be set independently of the temperature.

Furthermore, it is proposed that the voltage reduction value be activated at a second time point that lies later than the first time point during the turned-on switching state. In this embodiment variant, the voltage reduction value therefore does not need to be activated simultaneously with the first time point. Rather, a later second time point can be chosen in order to activate the voltage reduction value.

In this case the voltage reduction value is preferably dependent on temperature. The voltage reduction value can preferably likewise increase with increasing temperature. In this case too, a functional/relationship may be chosen such that it is aligned to physical properties of the field-effect transistor.

It is furthermore proposed that the voltage reduction value be greater at a third time point that lies later than the second time point during the turned-on switching state. This enables a particularly simple implementation for a temperature-dependent voltage reduction value. It is therefore possible to perform a corresponding adjustment by switching over the voltage reduction values at the respective time points. Further properties of the field-effect transistor and/or of the electronic circuit connected to the field-effect transistor can be taken into account as a result.

It proves particularly advantageous if the voltage comparison value is varied continuously as a function of time between the first and the second time point. With this development it can be provided that there is no abrupt jump in the voltage comparison value, Rather, a continuous transition follows from the voltage comparison value before the first time point and the voltage comparison value after the second time point. This enables an improved functionality to be achieved also in terms of the protection function in relation to the overload current.

Preferably, the voltage reduction value is varied at least in part linearly. Between the first and the second time point, a linear transition between the different voltage comparison values is therefore realized at least partially. This can be achieved by means of the at least partially linear variation of the voltage reduction value.

However, the voltage reduction value does not need to be varied in a linear manner. According to a development, it may also be varied at least partially exponentially. Of course, these embodiments may also be combined with one another in order to enable particularly advantageous and tailored functionalities to be achieved.

The advantages and effects cited for the method according to the invention apply equally to the protective device according to the invention and to the field-effect transistor equipped with the inventive protective device, as well as also vice versa. In that respect, device features may also be formulated for method features, and vice versa.

BRIEF DESCRIPTION OF THE DRAWING

Further advantages and effects as well as features will become apparent from the exemplary embodiments described below with reference to the figures. In the figures, like reference signs designate like features and functions.

In the figures.

DETAILED DESCRIPTION OF PREFERRED EMBODIMENTS

Figure 1:
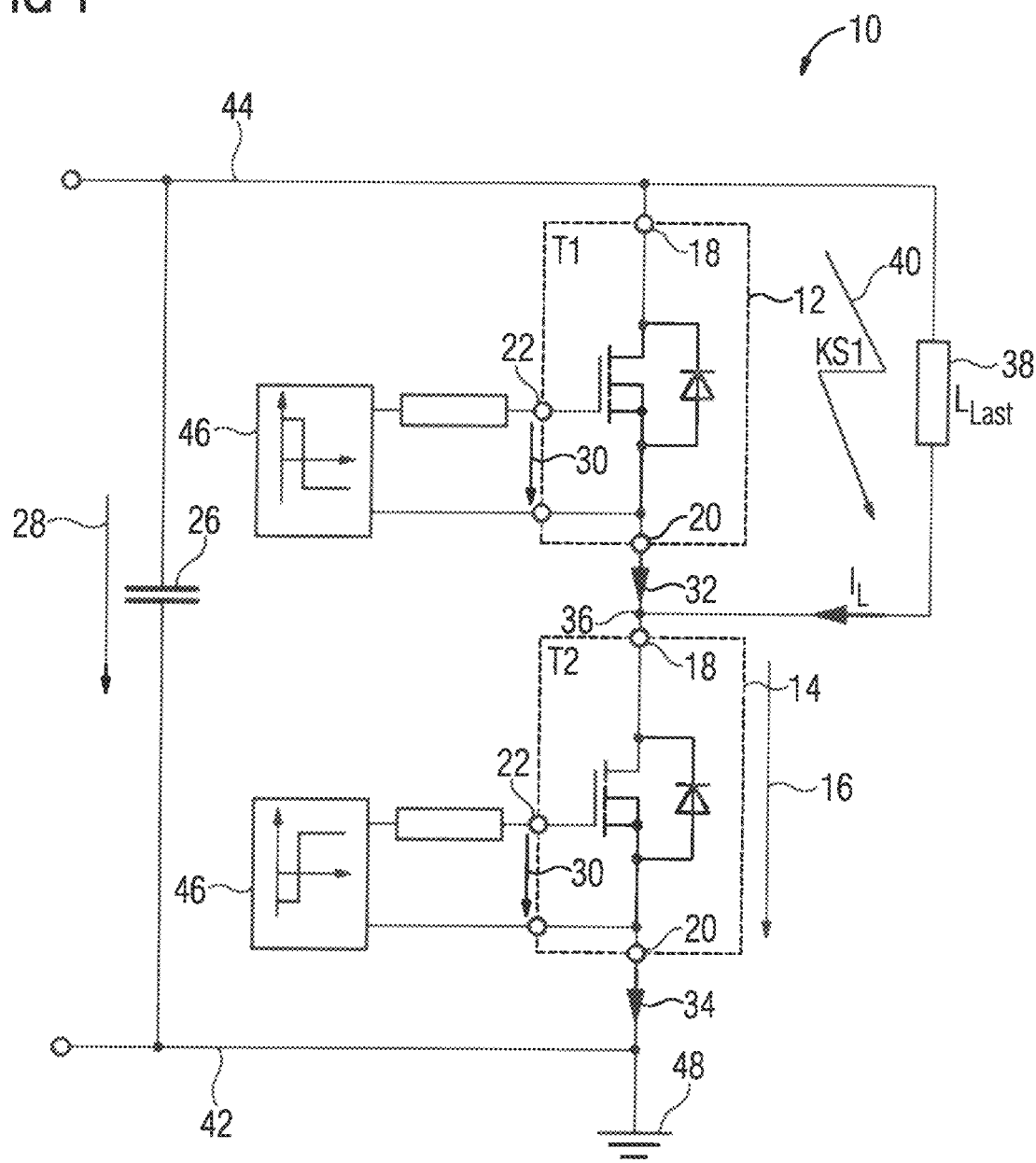
FIG. 1 shows in a schematic circuit diagram arrangement a half-bridge circuit comprising two series-connected MOSFETs as switching elements.

FIG. 1 shows in a schematic circuit diagram arrangement a half-bridge circuit 10, as finds application in energy converters, for example DC-to-AC inverters, AC-to-AC converters, DC-to-DC converters or the like. The half-bridge circuit 10 comprises a series circuit composed of two field-effect transistors, which in this case are embodied as MOSFETs 12, 14, the series circuit composed of the MOSFETs 12, 14 being connected to electrical potentials 42, 44 of a DC voltage intermediate circuit (not designated further).

The DC voltage intermediate circuit has a DC link capacitor 26 which is connected to the electrical potentials 42, 44, A DC link voltage 28 is provided between the electrical potentials 42, 44.

Each of the MOSFETs 12, 14 has a respective drain terminal 18, a respective source terminal 20 and a respective gate terminal 22. In the present example, the MOSFETs 12, 14 are embodied as of the enhancement-mode type and further comprise in each case an integrated inverse diode (not designated further).

For each of the two MOSFETs 12, 14, there is provided a respective driver circuit 46 which is connected by means of a reference potential terminal to the respective source terminal 20 and via an electrical resistance (not designated further) to the respective gate terminal 22 of the respective MOSFET 12, 14. The driver circuits 46 serve to control the MOSFETs 12, 14 in a switching mode of operation such that the MOSFETs 12, 14 are turned on or turned off in alternation. For this purpose, the driver circuits 46 receive corresponding control signals from a clock pulse generator (not shown in further detail). In the present example, the control signals are suitable square-wave signals representing a predefined clock pattern so that the half-bridge circuit 10 provides the desired functionality.

The driver circuits 46 are the means by which the MOSFETs 12, 14 are operated in the switching mode, i.e. in the normal mode of operation, a switching path between the respective drain terminal 18 and the respective source terminal 20 assumes either only a turned-on switching state or a turned-off switching state. For this purpose, the control circuits 46 provide corresponding gate control signals 30 at the respective gate terminals 22, which signals are typically formed substantially by square-wave signals such that the MOSFETs 12, 14 assume the desired switching state in each case.

Generally, it is provided here that only one of the two MOSFETs 12, 14 is ever in a turned-on switching state at any given time, whereas the corresponding other of the two MOSFETs 12, 14 is always in the respective turned-off switching state in the same time period. A short-circuit current that flows through both MOSFETs 12, 14 simultaneously is substantially avoided by this means.

The series circuit of the MOSFETs 12, 14 is formed in that the source terminal 20 of the MOSFET 12 is electrically connected directly to the drain terminal 18 of the MOSFET 14. A center terminal 36 of the series circuit is formed by this means.

An inductor is connected as a schematic load 38 to the center terminal 36 by a first terminal, while a second terminal of the load 38 is connected to the positive electrical potential 44, which in the present case represents the positive potential of the DC link voltage 28. The negative electrical potential 42 is electrically coupled in the present case to a grounding terminal 48. Said terminals of the load 38 are merely schematic in this case and, depending on the functionality and/or type of the load 38, may of course also be chosen differently or also be omitted in some cases.

It can also be seen from FIG. 1 that a respective drain-source voltage 16 ($U_{DS}$) drops at the respective MOSFETs 12, 14. The drain-source voltage 16 of the MOSFET 14 is shown simply by way of example in FIG. 1. In the same way, however, a corresponding drain-source voltage can also be observed at the MOSFET 12.

The drain-source voltage 16 ($U_{DS}$) can be detected in the turned-on switching state in order to determine for the respective MOSFET 12, 14 whether the latter is subjected to an overload current. For this purpose, the drain-source voltage 16 ($U_{DS}$) can be compared with a predefined voltage comparison value.

Field-effect transistors, in particular the MOSFETs 12, 14, provide, as unipolar semiconductor components in the turned-on switching state, a switching path that has a resistance-like characteristic. This enables the voltage comparison value to be significantly reduced compared with an application in the case of bipolar transistors such as e.g. insulated-gate bipolar transistors (IGBTs). Preferably, the voltage comparison value can be measured by a voltage drop along the switching path that corresponds approximately to a drain-source voltage which is present at a triple rated current of the MOSFET 12, 14.

Since the drain-source voltage, at least in the case of a load of said type, is dependent on a temperature of the MOSFET, in particular a chip temperature of a semiconductor chip of the MOSFET 12, 14, it is also provided in the present example for the voltage comparison value to be set as a function of a chip temperature measured by means of a temperature sensor (not shown in further detail).

Since the drain-source voltage 16 in the turned-on switching state is evaluated as a temperature-sensitive parameter for the purpose of a short-circuit detection, given a permanently set voltage comparison value, the corresponding current value as of which this will be detected as an overload current will vary as a function of the temperature of the MOSFET 12, 14, in particular its chip temperature. The following formula may be relevant in this case:

$$I_{SCD}/I_N \sim 1/I_{Rds,on}$$

Figure 2:
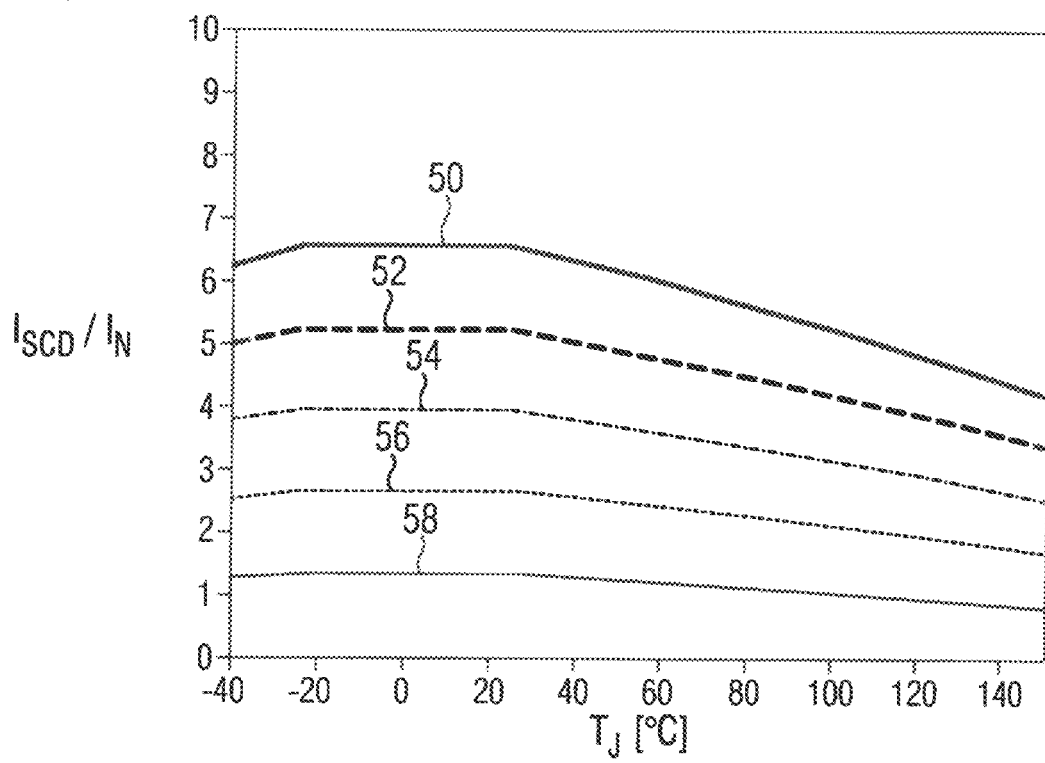
FIG. 2 shows a schematic diagram intended to illustrate short-circuit detection thresholds in a planar SiC MOSFET for a cutoff voltage of 1200 V as a function of a temperature of the MOSFET at a gate-source voltage of approx. 15 V as the control voltage.
Figure 3:
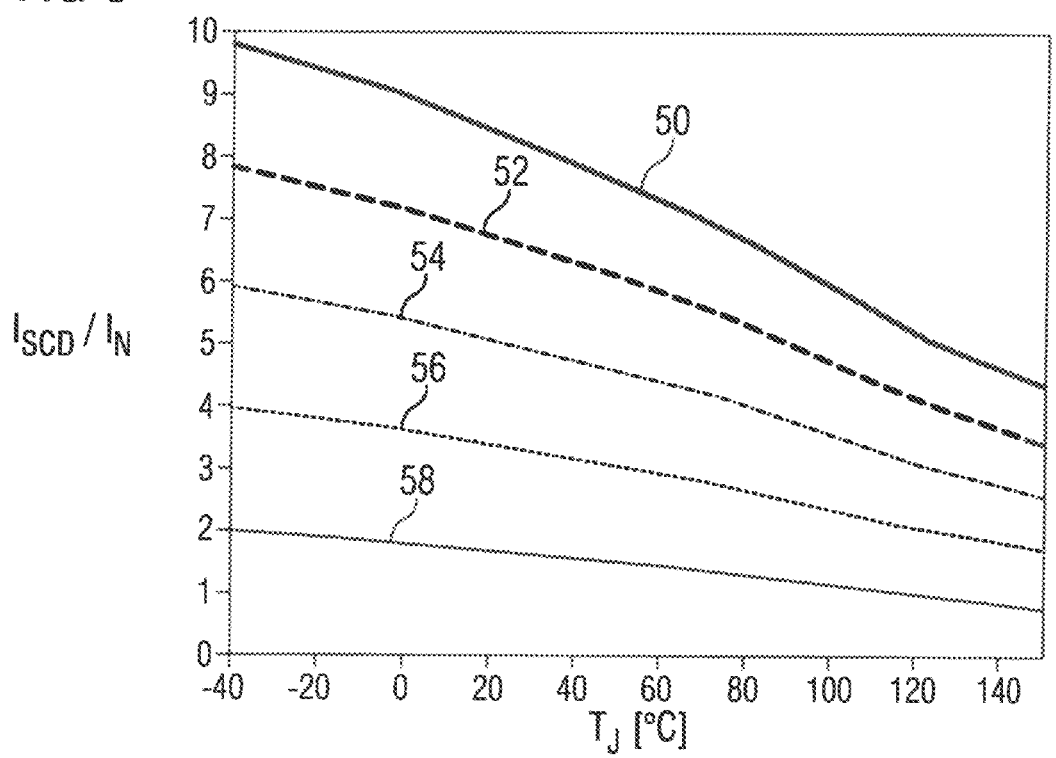
FIG. 3 shows a schematic diagram as in FIG. 2, in which the gate-source voltage as the control voltage now amounts to approx. 20 V.

Due to the high temperature dependence of the on-state resistance of the switching path of the MOSFETs 12, 14, in particular when they are embodied as planar or trench SiC MOSFETs, a deviation by a factor of 2, for example, may occur in normal operation, as can be seen from the schematic diagrams shown in FIGS. 2 and 3.

FIG. 2 shows a schematic diagram in which the abscissa is assigned to a chip temperature $T_J$ in ° C., and the ordinate to a current ratio $I_{SCD}$ corresponding to an overload current in relation to a rated current $I_N$. The graphs 50, 52, 54, 56, 58 shown in the diagram of FIG. 2 relate to different loads, Thus, graph 50 is assigned to a product from five times the rated current and an on-state resistance of the MOSFET 12, 14 ($5*I_N*R_{DS,on}$) Graph 52 is correspondingly assigned to the quadruple product from the rated current and the on-state resistance. Correspondingly, graph 54 is assigned to the triple product, graph 56 to the double product, and graph 58 to the single product. A gate-source voltage 30 of approx. 15 V is provided for this diagram illustration.

FIG. 3 shows a corresponding diagram illustration to FIG. 2, though in this case the gate-source voltage 30 amounts to approx. 20 V. With silicon MOSFETs, a compensation can be provided in such a way that a voltage divider by means of which the voltage comparison value is provided comprises a temperature-dependent resistor which serves as a temperature sensor in order to measure the chip temperature of the respective MOSFET 12, 14.

The detected drain-source voltage 16 can be compared with the voltage comparison value by providing e.g. a corresponding comparator or a comparator circuit or else a digital processing function by means of a computer unit. In addition, a blanking time can also be provided which may be realized by means of an analog RC element.

Even though the invention can be applied overall for field-effect transistors, in particular MOSFETs, it nonetheless proves particularly advantageous for use with wide-bandgap semiconductors. Wide-bandgap semiconductors are semiconductors having a band gap, i.e. an energy gap between a valence band and a conduction band, that lies at the upper end of the range of the semiconductors, e.g. greater than approx. 3 eV up to over approx. 4 eV or the like.

The properties of semiconductor materials are determined mainly by the band gap. There is no band gap in electrical conductors, while the band gap in non-conductors is typically greater than approx. 4 eV. In the case of a plurality of conventional prior art semiconductors, the band gap lies in a range significantly less than approx. 3 eV, thus e.g. at room temperature for germanium approx. 0.67 eV, for silicon at approx. 1.12 eV, for gallium arsenide approx. 1.42 eV, and so on.

In wide-bandgap semiconductors, the band gap is generally greater than approx. 3 eV. Using wide-bandgap semiconductors, in particular for transistors, particularly for field-effect transistors, can result in lower switching losses in a switching mode of operation. In addition, a withstand voltage may be higher in a turned-off switching state. Finally, semiconductors of said type are also suitable for use at high temperatures. Furthermore, higher frequencies can be used for normal operation and reliability can be improved. Materials for use in wide-bandgap semiconductors include e.g. silicon carbide, gallium nitride, zinc oxide and/or the like.

Figure 4:
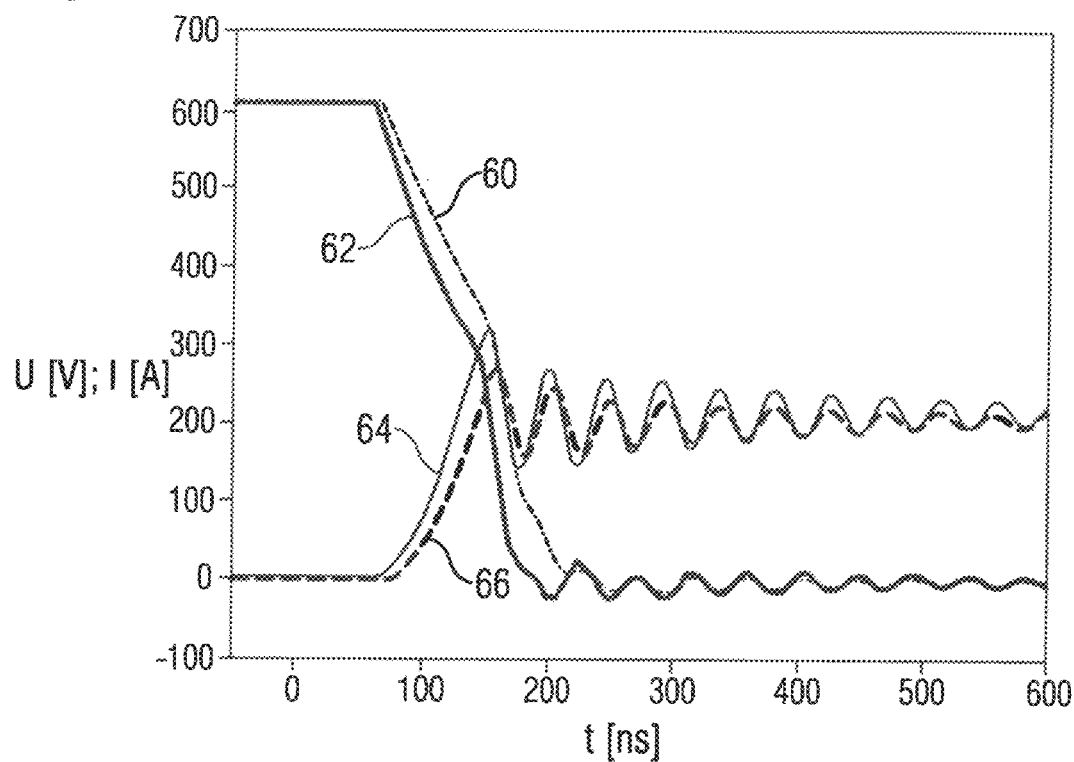
FIG. 4 shows a schematic diagram in respect of a turn-on behavior of a SiC MOSFET as a function of a temperature of the MOSFET as well as of a first commutating inductance.

FIG. 4 shows in a schematic diagram a turn-on behavior of a SiC MOSFET, such as the MOSFET 12, 14, at different chip temperatures $T_J$ and a commutating inductance $L_o$ of approx. 20 nH. The operating voltage in this case amounts to approx. 600 V. A drain current of approx. 200 A establishes itself in the turned-on switching state. $R_{G,ext}$ amounts to 17.2Ω in the present case.

In the diagram shown in FIG. 4, the abscissa is assigned to the time in ns. In contrast, the ordinate is assigned both to the voltage in V and to the current in A. The drain-source voltage 16 at the time of a turn-on action of the MOSFET 12 is illustrated by means of a graph 60. In the present case, the chip temperature lies at around 26° C. The same voltage is represented by means of a graph 62, though in this case the chip temperature amounts to 150° C. Graphs 64 and 66, which show a corresponding drain current when the MOSFET 14 is turned on, are assigned accordingly. Graph 64 is in this case assigned to the chip temperature 25° C., while graph 66 is assigned to the chip temperature 150° C. It can be seen that a current oscillation is excited during the turn-on action, said current oscillation decaying with increasing time.

Figure 5:
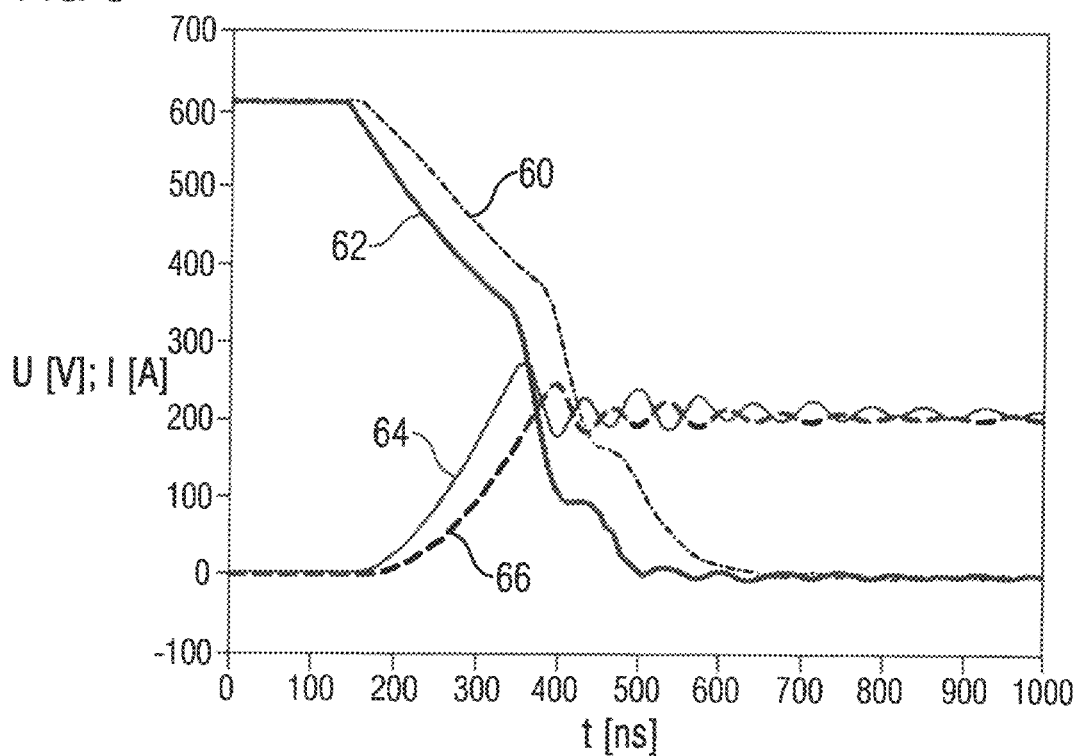
FIG. 5 shows a schematic diagram as in FIG. 4, though now for a second commutating inductance that is greater than the first commutating inductance.

FIG. 5 shows a similar schematic diagram to FIG. 4, though in this case the inductance amounts to approx. 125 nH. It can be seen that the steepness of the voltage drop according to graphs 60, 62 is less in this case than in the operating case according to FIG. 4. Similarly, a smaller oscillation is excited in the drain current, which oscillation furthermore also decays more quickly. An amplitude of the excited oscillation is likewise greater at the higher temperature.

It is evident from FIGS. 4 and 5 that the comparison voltage value can be set e.g. at least in part taking into account the decay behavior of the current oscillation. The overload current detection can be significantly improved as a result. Thus, a blanking time that is e.g. adjustable as a function of temperature can be provided which can be varied by approx. 100 ns between the switching states shown in FIGS. 4 and 5. At a rate of rise of the on-state current of e.g. approx. 3 amperes per second, this enables the detection of an overload current value to be reduced by approx, 300 A. The detection of the overload current can be significantly improved as a result.

The invention therefore makes use of the fact that the voltage comparison value may be dependent not only on the temperature of the field-effect transistor, in particular its chip temperature, but that in addition a temperature-dependent time dependence of the voltage comparison value can be provided. The invention therefore enables a two-dimensional tracking of the detection of an overload current.

Figure 6:
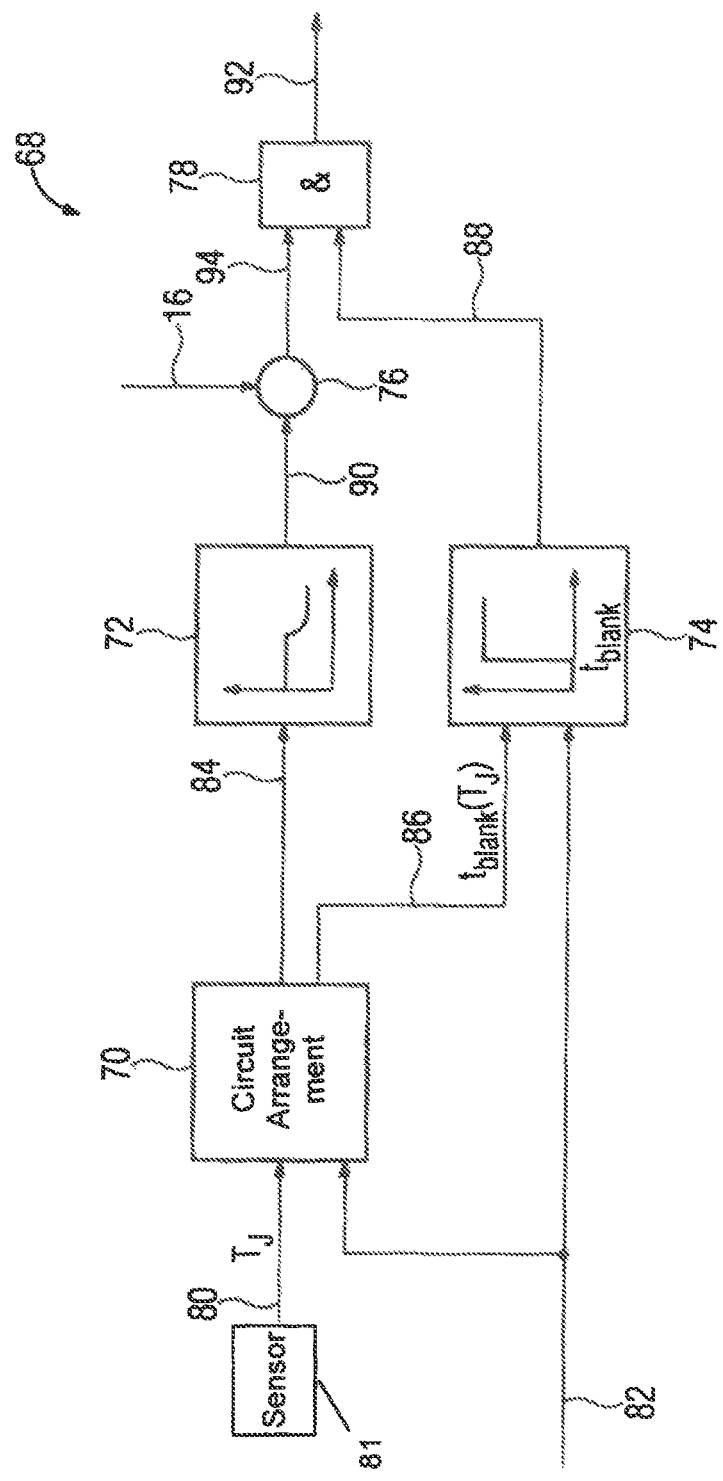
FIG. 6 shows a schematic block circuit diagram for a protective device according to the invention.

A schematic block circuit diagram for a circuit arrangement by means of which the invention can be realized is shown in FIG. 6. FIG. 6 shows a schematic block circuit diagram arrangement 68 which comprises a digital signal processing means with a circuit arrangement 70. In the present example, the circuit arrangement 70 is formed by a field-programmable gate array (FPGA). Alternatively or in addition hereto, a computer unit may also be provided which is controlled accordingly by means of a suitable computer program. As input variable, the circuit arrangement 70 is provided with a temperature signal 80 from a temperature sensor 81 which measures a chip temperature of the respective MOSFET 12, 14.

In addition, the circuit arrangement 70 receives, as input signal 82, a control signal which also serves to drive the MOSFET 12, 14 in a suitable manner in the switching mode of operation. As output signals, the circuit arrangement 70 supplies a digital signal 84 which serves to control a digital voltage source 72 accordingly. The digital voltage source 72 provides a reference signal as the voltage comparison value 90. The voltage comparison value 90 is fed to a compare system 76, to which the drain-source voltage 16 is likewise supplied. The compare system 76 compares the two signals 16, 90 and delivers a digital comparison signal as output signal 94, which is supplied to an AND gate 78.

In parallel herewith, a digital control signal 86 is provided by the circuit arrangement 70 and serves to set a first time point. Said signal is fed to an adjustable time delay circuit 74 which supplies, as output signal, a control signal 88, which is likewise supplied as an input signal to the AND gate 78. At the same time, the input signal 82 is also supplied as an input signal to the time delay circuit 74. The AND gate 78 supplies an output signal 92 (SODS) which serves to indicate an overload current. Said signal then serves in the further course of the process to turn off the respective MOSFET 12, 14 accordingly.

In the present case it is provided that the voltage comparison value 90 can be set in 256 increments by means of the adjustable voltage source 72 by way of the circuit arrangement 70. The voltage source 72 has an 8-bit input for this purpose. This not only allows a constant value to be set, but also a time-dependent voltage comparison value, as can be seen with reference to the following diagram according to FIG. 7.

Figure 7:
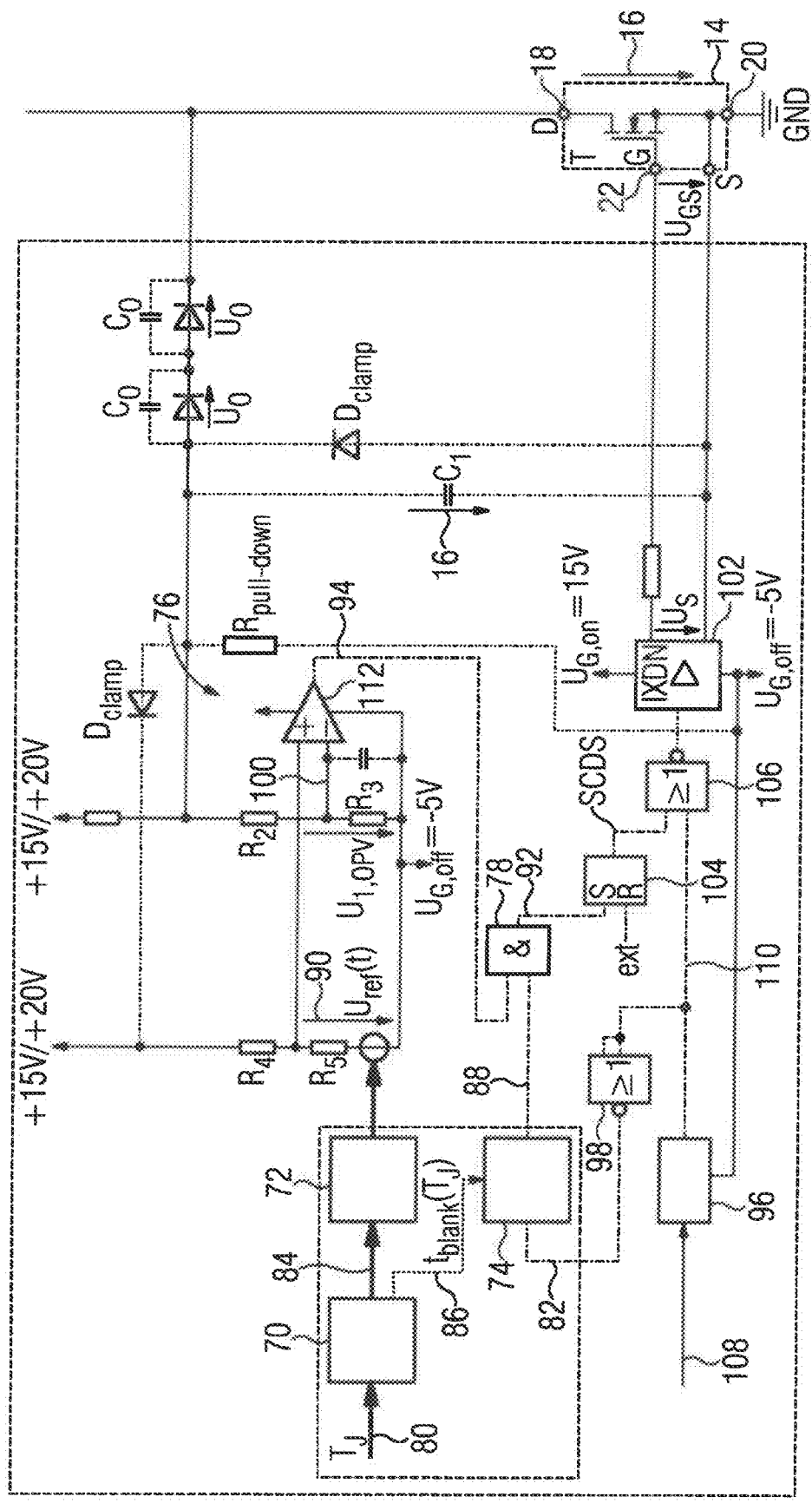
FIG. 7 shows a schematic circuit diagram for a driver circuit for a MOSFET in the half-bridge circuit according to FIG. 1 comprising a protective device according to the invention.

FIG. 7 shows a schematic circuit diagram for a driver circuit 46 for the MOSFET 14. A similar circuit may likewise be provided for the MOSFET 12.

The circuit arrangement 46 comprises an input at which a control signal 108 for the normal operation of the MOSFET 14 is supplied by the clock pulse generator. The control signal 108 is fed to an optocoupler 96 which serves to isolate the control signal 108 electrically from the potential of the MOSFET 14. As result, the optocoupler 96 supplies a volt-free control signal 110 which in terms of its temporal properties corresponds to the control signal 108.

The control signal 110 is supplied as input signal 82 via a NOR gate 98 to the time delay circuit 74. With regard to the further functions up to the AND gate 78, reference is made to the statements made in relation to FIG. 6. It should be noted that the output signal 92 is supplied to an S input of an RS flipflop 104, which accordingly outputs an output signal to a NOR gate 106. The control signal 110 is also supplied as an input signal to the NOR gate 106. As output signal, the NOR gate 106 supplies a control signal for a gate driver circuit 102, which drives the MOSFET 14 accordingly at its gate terminal 22.

The compare system 76 is illustrated in more detail in FIG. 7. It comprises a comparator 112, at the non-inverting input of which the voltage comparison value 90 is provided. A comparison voltage 100 derived from the drain-source voltage 16 is supplied at the inverting input. The comparator 112 supplies the output signal 94 as already explained hereinabove.

The circuit arrangement 68 of the invention also permits the blanking time, and moreover the first time point, to be tracked by means of the circuit arrangement 70 of the digital time delay circuit 74 as a function of the temperature. This results in a protection range for the respective MOSFET 12, 14 which can be two-dimensionally temperature-compensated. If the drain-source voltage 16 exceeds the voltage comparison value 90 in the turned-on switching state, the output signal 94 jumps to "high", and as soon as the elapsed time t is greater than the first time point, this is detected as an overload current event. At the same time, the corresponding signal (short-circuit detection signal (SCDS)) is supplied to the RS flipflop 104, thereby setting the latter. As soon as this signal is applied, the gate driver circuit 102 for the MOS ET 14 or 12 is deactivated even though the control signal 110 continues to request the turned-on switching state.

The driver circuit 46 can of course also be built with a different structural layout in order to realize the desired functionality according to the invention, in that respect, the description is to be understood simply as serving to explain the invention with reference to an exemplary embodiment, and not as limiting the subject matter of the invention.

The voltage comparison value 90 can in this case be tracked in the following ways: In a first time period between a commencement of the turned-on switching state up to the first time point $t_1$, it can be provided that the voltage comparison value be set to a maximum value to allow the rapid detection of short-circuits of the first case. In a time period that is greater than a second time point $t_2$, where the second time point $t_2$ lies later than the first time point $t_1$, the voltage comparison value 90 can be changed to a lower value to allow faster detection of short-circuits of the second and third case and to provide detection of the overcurrent case. For a transition period between the first time point $t_1$ and the second time point $t_2$, the voltage comparison value 90 can be transitioned from the fixed maximum value to the value at the time point $t_2$. For this, e.g. two different methods can be provided.

Thus, it is possible to perform the transition linearly, which of course also enables a simple programmability of the transition to be achieved. A programming operation can be performed e.g. taking into account the following formula:

$$U_{ref,1-on} = U_{ref,1} - \left( \frac{U_{ref,1} - U_{ref,on}}{\square} (t_2 - t_1) \right) \cdot t$$

In addition, it is possible to realize an exponential transition. This can be accomplished e.g. using the following formula:

$$1 - e^{\frac{t-t_1}{\tau}} + U_{ref1}\Big)$$

In this case the time constant τ of the e-function can be chosen to match the decay constant, as has been explained e.g. with reference to FIGS. 4 and 5.

Figure 8:
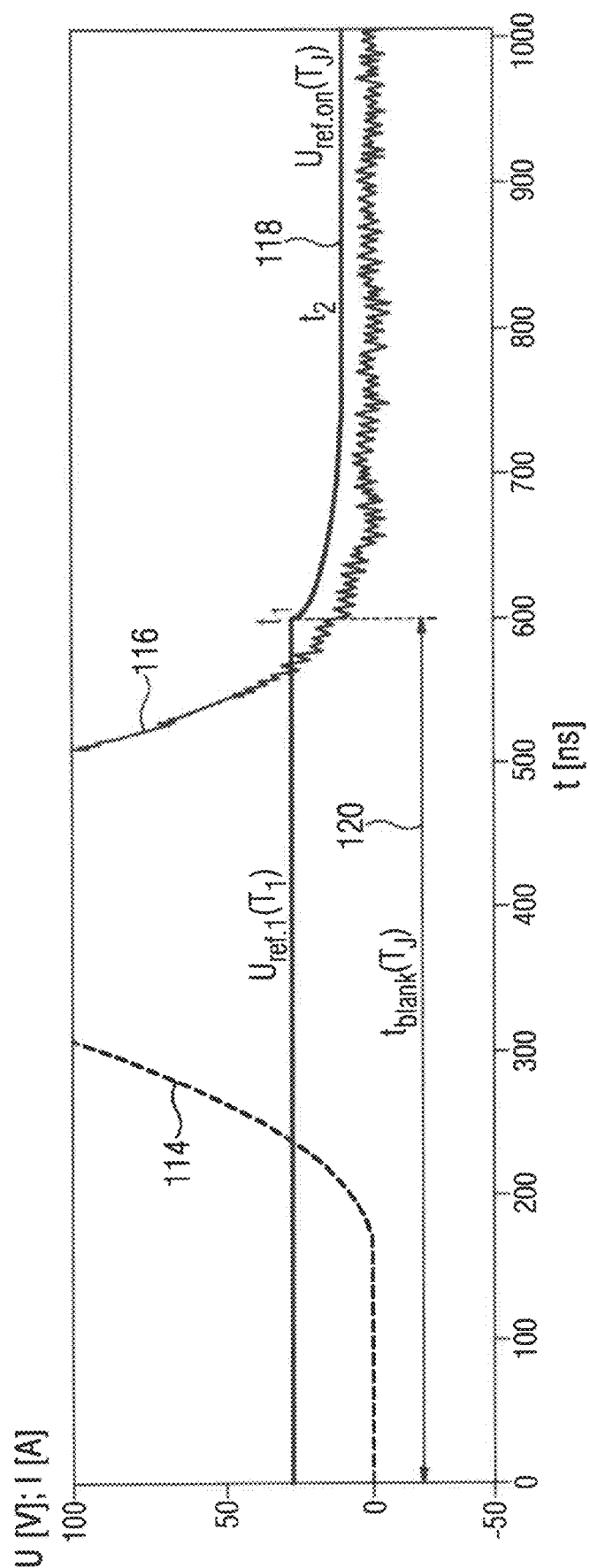
FIG. 8 shows a schematic diagram intended to illustrate a protection range which can be achieved by means of the protective device of the invention.

FIG. 8 shows a schematic diagram which represents the protection range for the overload current detection in relation to the corresponding cases 1 to 3. Here, the abscissa is again assigned to the time in ns and the ordinate to the electrical voltage in V or, as the case may be, to the electrical current in A. In the present example, the operating voltage amounts to approx. 600 V. The inductance $L_\sigma$ amounts to approx. 125 nH. The drain current is at approx. 200 A and the electrical resistance $R_{G,ext}$ amounts to approx. 17.2Ω.

In FIG. 8, a graph 114 shows the current profile of the drain current, whereas a graph 116 represents the voltage profile of the drain-source voltage 16. The voltage profile of the voltage comparison value 90 is represented by a graph 118. Graph 120 represents the blanking time, which is limited by the time point $t_1$ as first time point.

The invention can be realized both by an analog hardware circuit and by a digital circuit or also by means of a computer unit. Of course, these implementation options may also be combined with one another in a suitable manner.

By means of the invention it is possible to realize an already existing analog solution variant of the temperature tracking of the voltage comparison value 90 digitally using a temperature-dependent resistor by way of e.g. a digital voltage source. At the same time, a setting of the blanking time or of the first time point $t_1$ can also be realized digitally. This enables a two-dimensional tracking to be realized. This permits a protection range to be defined individually by the user and at the same time a corresponding temperature compensation to be provided.

It is therefore not necessary with the invention to provide a separate evaluation by means of separate detection paths for the voltage comparison value and the blanking time. The invention permits e.g. two separate voltage comparison values to be provided and these to be realized by means of separate blanking times. It is thus possible to realize a large voltage comparison value with a short blanking time for the detection of overload current events of case 1 and a smaller voltage comparison value which enables digital temperature compensation for the detection of overload current events of cases 2 and 3 as well as an overcurrent after a further blanking time.

The exemplary embodiments serve solely to explain the invention and are not intended to limit the same.

What is claimed is:

1. A method for protecting a field-effect transistor operated in a switching mode against an overload current in a turned-on switching state, the method comprising:
measuring an electrical drain-source voltage between a drain terminal and a source terminal of the field-effect transistor,
measuring a temperature of the field-effect transistor,
comparing the drain-source voltage with a predefined voltage comparison value which is set depending on a temperature and a time during the turned-on switching state,
switching the field-effect transistor into a turned-off switching state when the measured electrical drain-source voltage is greater than the predefined voltage comparison value, and
in the turned-on switching state
reducing the predefined voltage comparison value at a predefined first time in an exponential fashion by a predefined voltage reduction value,
selecting a time constant commensurate with a decay time constant of an oscillation of the measured electrical drain-source voltage,
setting the predefined voltage comparison value to a constant value independent of a measured temperature between a turn-on time of the field-effect transistor and the predefined first time, and
setting and activating the voltage reduction value depending on a measured temperature at a second time that occurs later than the predefined first time.

2. The method of claim 1, wherein the predefined first time is dependent on the temperature of the field-effect transistor.

3. The method of claim 1, wherein the predefined first time occurs at an earner time with increasing temperature of the field-effect transistor.

4. The method of claim 1, wherein during the turned-on switching state, the voltage reduction value is greater at a third time that occurs later than the second time.

5. The method of claim 1, wherein the predefined, voltage comparison value is varied continuously as a function of time between the predefined first time and the second time.

6. A protective device for protecting a field-effect transistor operated in a switching mode against an overload current in a turned-on switching state, wherein the protective device is configured to
measure a temperature of the field-effect transistor,
measure an electrical drain-source voltage between a drain terminal and a source terminal of the field-effect transistor,
compare the measured electrical drain-source voltage with a predefined voltage comparison value, and
switch the field-effect transistor into a turned-off switching state when the measured electrical drain-source voltage is greater than the predefined voltage comparison value,
in the turned-on switching state
set the predefined voltage comparison value additionally also as a function of time,
reduce the predefined voltage comparison value at a predefined first time in an exponential fashion by a predefined voltage reduction value,
select a time constant commensurate with a decay time constant of an oscillation of the measured electrical drain-source voltage,
set the predefined voltage comparison value to a constant value independent of a measured temperature between a turn-on time of the field-effect transistor and the predefined first time, and
set and activate the predefined voltage reduction value depending on a measured temperature at a second time that occurs later than the predefined first time.

7. A field-effect transistor, comprising the protective device as set forth in claim 6.

8. An energy converter, comprising:
a field-effect transistor,
a driver circuit operating the field-effect transistor in a switching mode,
a temperature sensor measuring a temperature of the field-effect transistor, and a protective device for protecting the field-effect transistor operated in the switching mode against an overload current in a turned-on switching state, said protective device configured to measure an electrical drain-source voltage between a drain terminal and a source terminal of the field-effect transistor, compare the measured electrical drain-source voltage with a predefined voltage comparison value, and switch the field-effect transistor into a turned-off switching state when the measured electrical drain-source voltage is greater than the predefined voltage comparison value, and in the turned-on switching state set the predefined voltage comparison value additionally also as a function of time, reduce the predefined voltage comparison value at a predefined first time in an exponential fashion by a predefined voltage reduction value, select a time constant commensurate with a decay time constant of an oscillation of the measured electrical drain-source voltage, set the predefined voltage comparison value to a constant value independent of a measured temperature between a turn-on time of the field-effect transistor and the predefined first time, and set and activate the predefined voltage reduction value depending on a measured temperature at a second time that occurs later than the predefined first time.

9. The energy converter of claim 8, wherein the energy converter is a converter selected from a group consisting of an AC-to-AC converter, a DC-to-AC inverter and a DC-to-DC converter.

* * * * *